United States Patent [19]
Ohe et al.

[11] Patent Number: 5,247,456
[45] Date of Patent: Sep. 21, 1993

[54] METHOD AND APPARATUS FOR FORMING LAYOUT PATTERN OF SEMICONDUCTOR INTEGRATED CIRCUIT

[75] Inventors: Ryoichi Ohe, Isehara; Koichi Yamashita, Kawasaki, both of Japan

[73] Assignee: Fujitsu Limited, Kawasaki, Japan

[21] Appl. No.: 433,334

[22] Filed: Nov. 8, 1988

[30] Foreign Application Priority Data

Nov. 8, 1988 [JP] Japan ............................. 63-281592

[51] Int. Cl.$^5$ ............................................. G06F 15/60
[52] U.S. Cl. .................................... 364/491; 364/490; 364/489; 364/488
[58] Field of Search ................ 364/488, 489, 490, 491

[56] References Cited

U.S. PATENT DOCUMENTS

| | | | |
|---|---|---|---|
| 4,580,228 | 4/1986 | Noto | 364/491 |
| 4,613,940 | 9/1986 | Shenton et al. | 364/491 |
| 4,630,219 | 12/1986 | DiGiacomo et al. | 364/488 |
| 4,636,965 | 1/1987 | Smith et al. | 364/491 |
| 4,644,187 | 2/1987 | Haji | 364/491 |
| 4,651,284 | 3/1987 | Watanabe et al. | 364/491 |
| 4,703,435 | 10/1987 | Darringer et al. | 364/489 |
| 4,744,047 | 5/1988 | Okamoto et al. | 364/491 |
| 4,745,084 | 5/1988 | Rowson et al. | 364/491 |
| 4,829,446 | 5/1989 | Draney | 364/491 |

FOREIGN PATENT DOCUMENTS 0126525 11/1984 European Pat. Off. .
0169576 1/1986 European Pat. Off. .

OTHER PUBLICATIONS

Proceedings of the IEE 1985 Custom Integrated Circuits Conf. Portland, Oreg., May 20-23, 1985, pp. 267-271, IEEE N.Y. K. Nagao et al.: "Super integration".
European Search Report dated Mar. 27, 1991.

*Primary Examiner*—Vincent N. Trans
*Attorney, Agent, or Firm*—Staas & Halsey

[57] ABSTRACT

A method and an apparatus is provided for forming a layout pattern of a semiconductor integrated circuit comprising automatically reforming a layout pattern by only carrying out a routing process, when a required layout pattern is the same as an existing layout pattern at the transistor-constitution level. Further, a method or an apparatus is provided for forming a layout pattern of a semiconductor integrated circuit comprising automatically reforming a layout pattern without analyzing the logical information down to the transistor-constitution level, when a required layout pattern is not the same as an existing layout pattern in the transistor-constitution level. Therefore, processing can be simplified and operation speed can be increased.

26 Claims, 15 Drawing Sheets

Fig. 3

```
X  LOGICIAN  FLDLALMCF       X
X       KEV-02        20-OCT-84 X
X  16-FAR-1966 14:59         X
USER       : HANZKEN  :
SYSTEM     : O8FP     :
REVISION   : 0001     :
DATA       : 86/01/22 :
DESIENER   : HANZKEN  :
X  2  4          · X
NAME       :N2P      :
 PURPOSE:LOGSIM. LAYOUT   :
 LEVEL     :CHIP   :
INPUTS     :. A1.. A2  :
OUTPUTS    :. X  :
TYPES    :
NZN  :AAAA:
VZB  :AAAB   :
EMOTYPES:
METS     :
   S-2            :. A1. AAAA. A1 :
   S-3            :. A2. AAAA. A2 :
   S-4            :. X. AAAB. X :
   S-5            :AAAA. X. AAAB. A :
ENONETS  :
ENONAME  :N2P           :
X———————————————————X
X———————————————————X
X   << CROSS REFERENCE LIST >>
  ...CHIP      =>N2P
   ..(AEER/DHRA18Z/N2P)
    . (DN2P)
      (EXTERNALS)
         X                   1        OUT
         A2                  1        IN
         A1                  1        IN
      (COMPOMENT)
         AAAA     N2N       XCMP1         1
             DN2P
         AAAB     V2B       XCMP2         1
             DN2P
      (SIGNALS)
         S-2       A1                 1
         S-3       A2                 1
         S-4       X                  1
         S-5       XSIG3              1
   <<    E  N  D    >>      X
X——————————————————————X
X    << MESSEAGE LIST >>
 ···<<<< S T A R T >>>>··
  ····       REV-02         ····
  ····  14-MAR-1986 14:59 ···
  ·······················
       ═>>   (CONTEXT)                (PAGE-KEY)
       ═>>   ANSER/DHE/LIBZ/N2P         1 (AA)
   ····<<<< E N D >>>>······
       ═>ANSER/DHE/LIBZ/N2P FLDL. SRCS
       <<    E  N  D    >>     X
ENDUSER    :
```

GRID DISTANCE

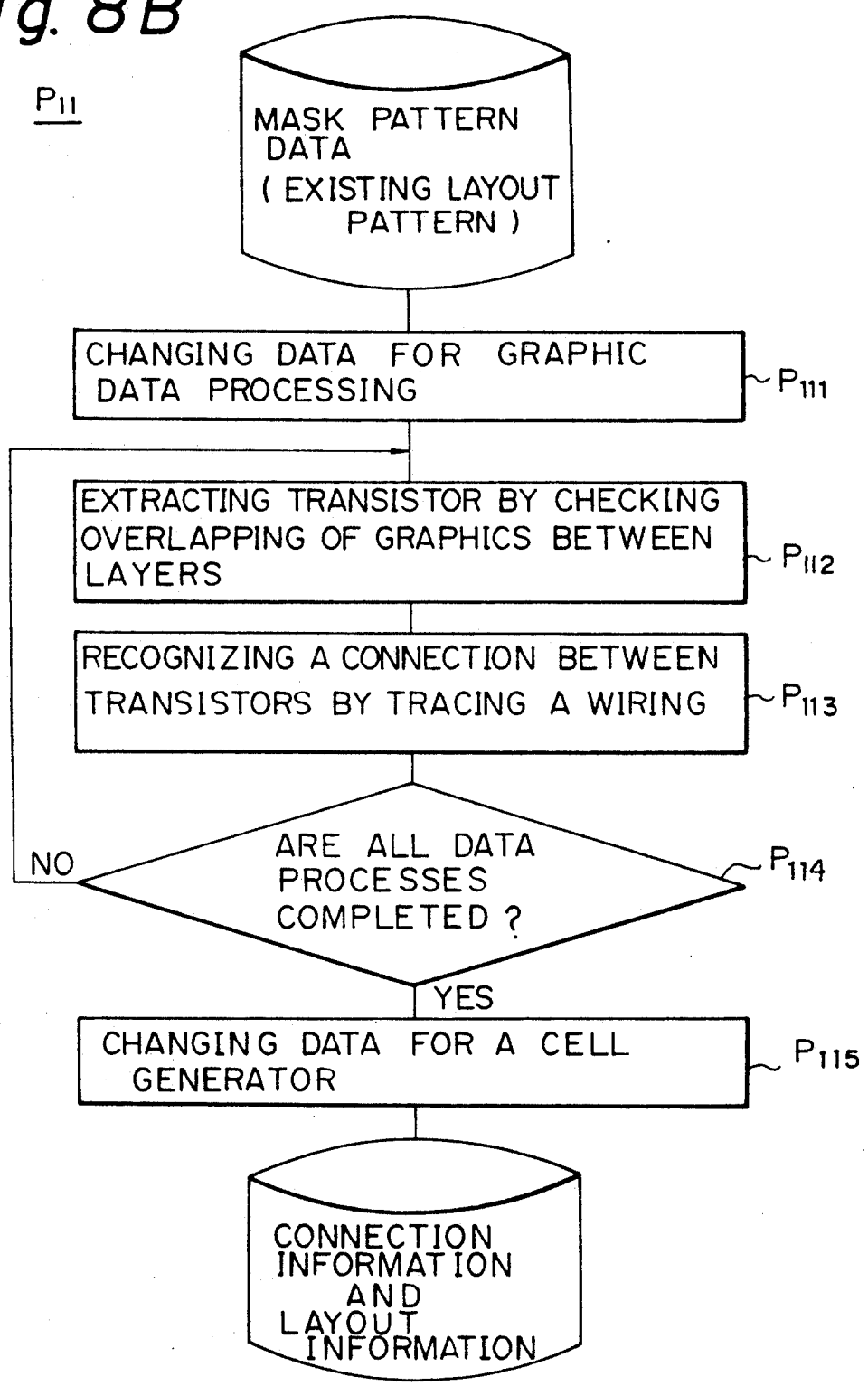

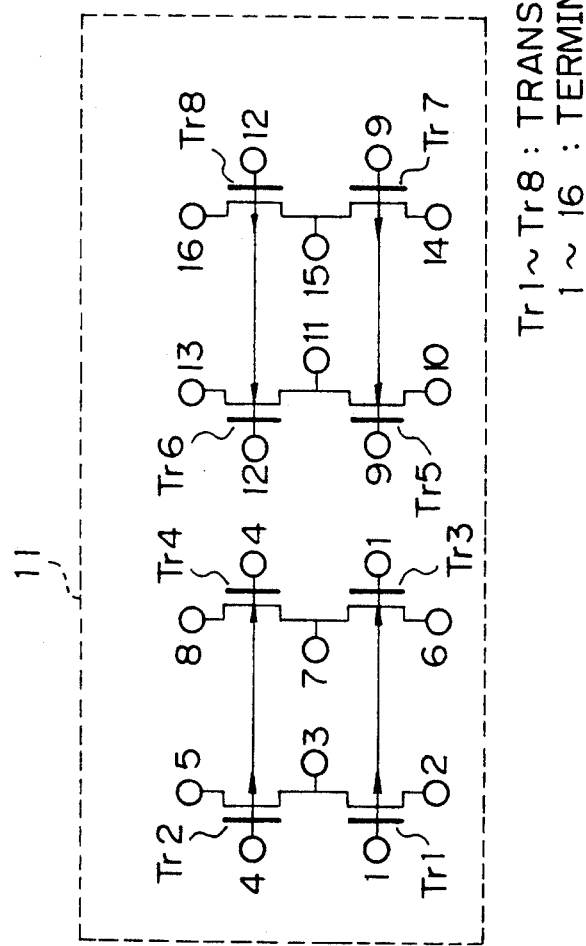

Fig. 9B

| No. | TYPE | G | S/D | S/D |
|-----|------|---|-----|-----|
| Tr 1 | P ch | <u>1</u> | 2 | <u>3</u> |
| Tr 2 | P ch | 4 | <u>3</u> | 5 |
| Tr 3 | N ch | <u>1</u> | 6 | 7 |
| Tr 4 | N ch | 4 | 7 | 8 |
| Tr 5 | N ch | 9 | 10 | 11 |
| Tr 6 | N ch | 12 | 11 | 13 |
| Tr 7 | P ch | 9 | 14 | 15 |
| Tr 8 | P ch | 12 | 15 | 16 |

| |
|---|
| 2、14、16、19、21、V$_{DD}$ |
| 13、23、24、V$_{ss}$ |
| 5、7、18 |
| 6、8、22 |
| 10、15、17 |
| 1、9 |
| 4、12 |

METHOD AND APPARATUS FOR FORMING LAYOUT PATTERN OF SEMICONDUCTOR INTEGRATED CIRCUIT

BACKGROUND OF THE INVENTION

1. Field of the Invention

The present invention relates to a method and an apparatus for forming a layout pattern of a semiconductor integrated circuit, more particularly, to a method and an apparatus for forming a layout pattern of a semiconductor integrated circuit using a cell generator which automatically forms a layout pattern of a large scale integrated circuit (LSI) to simplify processing and carry out high speed operation of the cell generator using layout information of an existing layout pattern.

2. Description of the Related Art

Recently, a CAD (computer aided design) tool such as a cell generator for automatically forming a hard mask of a gate array or a mask pattern in a cell library of a standard cell LSI has been studied and improved. Furthermore a method for forming a layout pattern of a semiconductor integrated circuit using the cell generator, is actively being studied. In the automatic forming processes of a layout pattern, automatic layout techniques and automatic wiring techniques in a cell or a functional block have become advanced, and are now actually being used.

Generally, a functional block, such as a cell in a cell library of a standard cell LSI, is formed by a cell generator using logical information, and the logical information, which includes connection information and layout information, is indicated by a logical circuit diagram or a programming language, i.e., a logical description language. Note, for example, information of a logical circuit diagram is processed in a CAD tool, that is, a logical circuit diagram is entered into the CAD tool and data of the logical circuit diagram is translated into a logical description language. A layout pattern of the functional block is, for example, formed by the cell generator by inputting logical information of a logical description language. Note, the logical information of the logical description language may be directly produced or input by a human operator.

As described above, a layout pattern is automatically formed by carrying out the placement process and the routing process of the transistor-constitution level. Note, the layout pattern obtained by the cell generator is not only one type but a plurality of types, and it is difficult to obtain an optimum layout pattern from those plural layout patterns. Further, almost all layout patterns formed by the cell generator are larger size than a layout pattern formed by a person. Consequently, in practice, placement processing of small blocks is previously carried out by a person, and only the routing process is carried out by a computer system, e.g., a cell generator.

SUMMARY OF THE INVENTION

It is an object of the present invention to provide a method and an apparatus for producing a semiconductor device which can simplify processing in a cell generator and shorten the operation speed of the cell generator, and furthermore, to provide a method and an apparatus for producing a semiconductor device which can automatically form a required layout pattern by using only connection information of an existing layout pattern without carrying out an input processing of a logical circuit diagram and forming a logical description language, if an optimum layout is not found.

According to the present invention, there is provided a method of forming a layout pattern of a semiconductor integrated circuit comprising, a step of analyzing logical information down to a transistor-constitution level and inputting the analyzed logical information into a cell generator, and a step of automatically forming a layout pattern by carrying out a placement process and a routing process at the transistor-constitution level by the cell generator, wherein the method further comprises, a step of automatically reforming a layout pattern by only carrying out the routing process, when required logical information is the same as existing logical information and a required layout pattern is also the same as an existing layout pattern at the transistor-constitution level, by inputting connection information and layout information of the existing layout pattern into the cell generator.

The logical information may be indicated by a logical circuit diagram or a logical description language. The required layout pattern and the existing layout pattern may be constituted by a plurality of basic cells including a plurality of transistors.

A pattern of the transistor in the basic cell of the required layout pattern may be different from that of the existing layout pattern. A gate length of the transistor in the basic cell of the required layout pattern may be different from that of the existing layout pattern. A gate width of the transistor in the basic cell of the required layout pattern may be different from that of the existing layout pattern.

The reformed layout pattern may be used to constitute a cell including some logic gates. The method may be applied to a cell generator using a computer system.

Further, according to the present invention, there is also provided a method of forming a layout pattern of a semiconductor integrated circuit comprising, a step of analyzing logical information down to a transistor-constitution level and inputting the analyzed logical information into a cell generator, and a step of automatically forming a layout pattern by carrying out a placement process and a routing process at the transistor-constitution level by the cell generator, wherein the method further comprises, a step of automatically reforming a layout pattern without analyzing the logical information down to the transistor-constitution level, when required logical information is the same as existing logical information but a required layout pattern is not the same as an existing layout pattern at the transistor-constitution level, by inputting connection information of the existing layout pattern into the cell generator.

The logical information may be indicated by a logical circuit diagram or a logical description language. The required layout pattern and the existing layout pattern may be constituted by a plurality of basic cells including a plurality of transistors.

A pattern of the transistor in the basic cell of the required layout pattern may be different from that of the existing layout pattern. A constitution of the transistor in the basic cell of the required layout pattern is different from that of said existing layout pattern.

The reformed layout pattern may be used for constituting a cell including some logic gates. The method may be applied to a cell generator using a computer system.

Furthermore, according to the present invention, there is also provided an apparatus for forming a layout pattern of a semiconductor integrated circuit comprising, a unit for analyzing logical information indicated by a logical circuit diagram or a logical description language down to a transistor-constitution level and inputting the analyzed logical information into a cell generator, a unit for automatically forming a layout pattern by carrying out a placement process and a routing process of the transistor-constitution level by the cell generator, a first reforming unit for automatically reforming a layout pattern by only carrying out the routing process, when required logical information is the same as existing logical information and a required layout pattern is also the same as an existing layout pattern at the transistor-constitution level, by inputting connection information and layout information of the existing layout pattern into the cell generator, and a second reforming unit for automatically reforming a layout pattern without analyzing the logical information down to the transistor-constitution level, when required logical information is the same as existing logical information but a required layout pattern is not the same as an existing layout pattern at the transistor-constitution level, by inputting connection information of the existing layout pattern into the cell generator.

The logical information may be indicated by a logical circuit diagram or a logical description language. The required layout pattern and the existing layout pattern may be constituted by a plurality of basic cells including a plurality of transistors.

The first reforming unit may automatically reform a layout pattern by only the routing process, even if a pattern of the transistor in the basic cell of the required layout pattern is different from that of the existing layout pattern. The first reforming unit may automatically reform a layout pattern by only the routing process, even if a gate length of the transistor in the basic cell of the required layout pattern is different from that of the existing layout pattern. The first reforming unit may automatically reform a layout pattern by only the routing process, even if a gate width of the transistor in the basic cell of said required layout pattern is different from that of said existing layout pattern.

The second reforming unit may automatically reform a layout pattern without analyzing the logical information down to the transistor-constitution level, when a constitution of the transistor in the basic cell of the required layout pattern is different from that of the existing layout pattern.

The reformed layout pattern may be used for constituting a cell including some logic gates. The apparatus is applied as a cell generator in a computer aided design system.

BRIEF DESCRIPTION OF THE DRAWINGS

The present invention will be more clearly understood from the description of the preferred embodiments as set forth below with reference to the accompanying drawings, wherein:

FIG. 3 is a diagram indicating an example of a logical description language for inputting logical information into the cell generator;

FIG. 8B is a flowchart indicating processes in an extracting process shown in FIG. 8A;

FIG. 9A is a diagram indicating a transistor-constitution in an example of a basic cell;

FIG. 9B is a diagram indicating transistor connections in the basic cell shown in FIG. 9A;

DESCRIPTION OF THE PREFERRED EMBODIMENTS

For a better understanding of the preferred embodiments of the present invention, the problems of the related art will be explained first.

Figure 1:
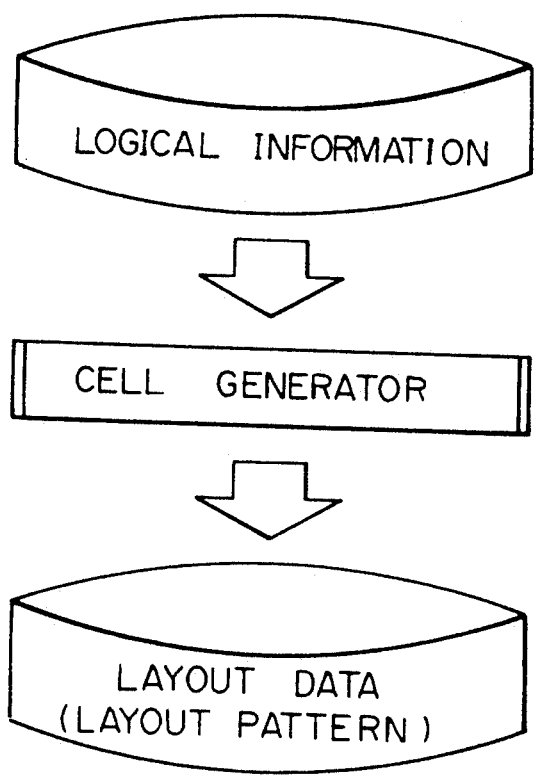
FIG. 1 is a schematic diagram indicating processes of a cell generator according to the prior art.

Conventionally, CAD tools such as a cell generator have been studied and provided. FIG. 1 is a schematic diagram indicating the processes of a cell generator according to the prior art. Generally, in a cell generator, input data of the cell generator is logical information indicated by a logical circuit diagram or a logical description language. Namely, as shown in FIG. 1, in a method for forming a layout pattern of a semiconductor integrated circuit using the cell generator according to the prior art, the logical information is analyzed down to a transistor-constitution level and the analyzed logical information is input into the cell generator, and layout data (a layout pattern) is automatically formed by a placement process and a routing process by the cell generator. Note, the logical information, which may be called a NET LIST, includes connection information and layout information.

Figure 2:
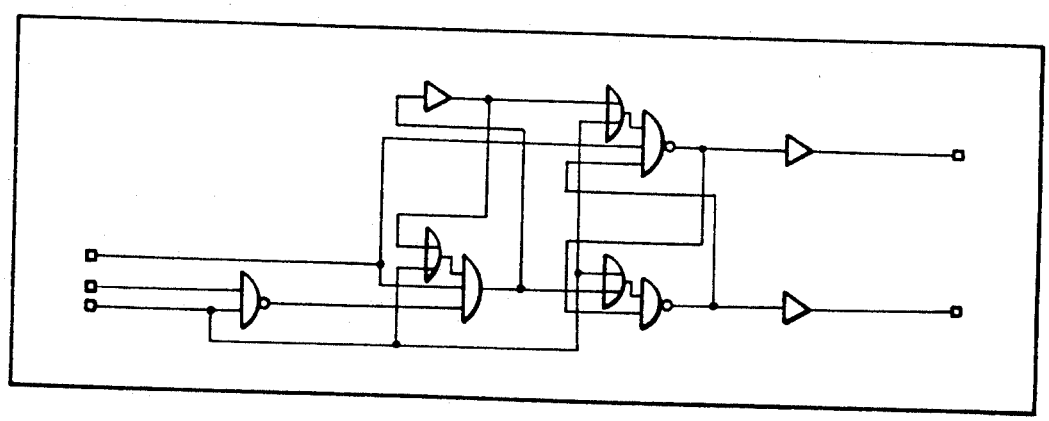
FIG. 2 is a diagram indicating an example of a logical circuit for inputting logical information to the cell generator.
Figure 4:
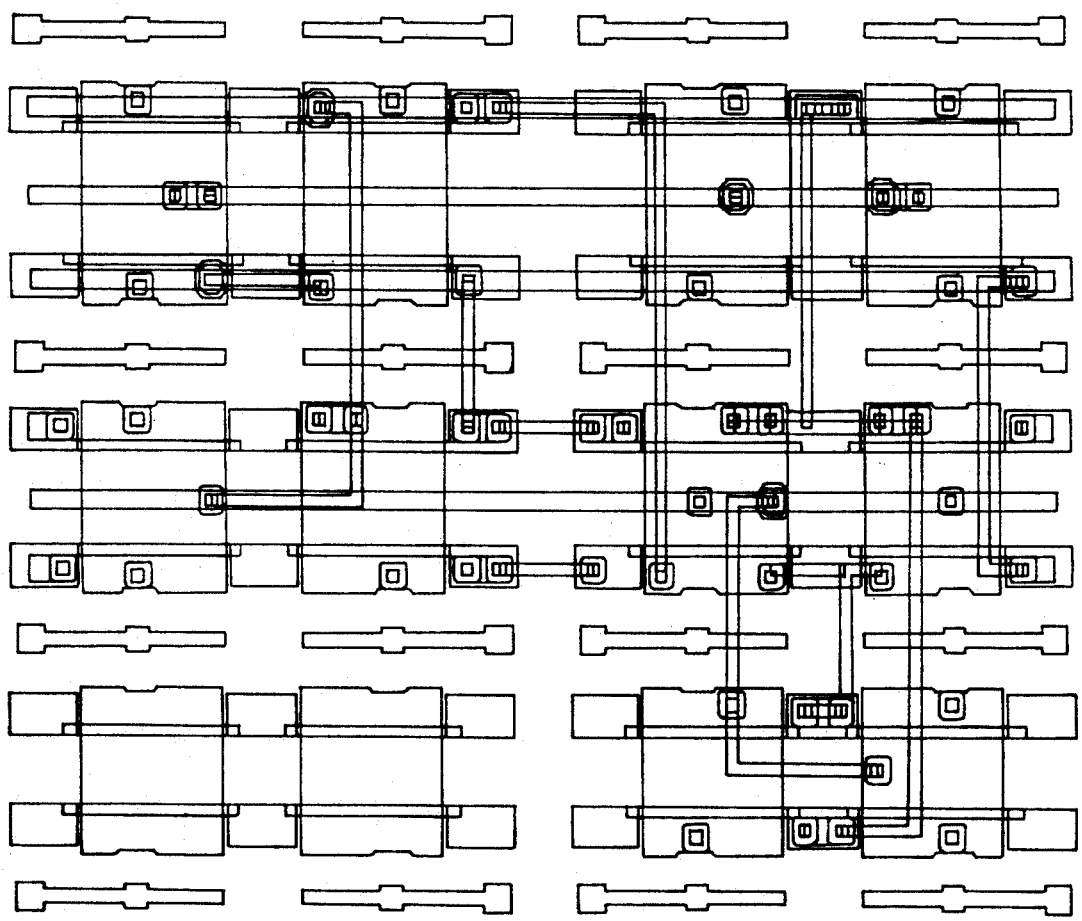
FIG. 4 is a diagram indicating an example of a layout pattern generated in accordance with the logical information of the logical circuit or the logical description language.

FIG. 2 is a diagram indicating an example of a logical circuit for inputting logical information into the cell generator, FIG. 3 is a diagram indicating an example of a logical description language for inputting logical information into the cell generator, and FIG. 4 is a diagram indicating an example of a layout pattern generated in accordance with the logical information of the logical circuit or the logical description language.

As described above, a functional block, e.g., a cell in a cell library of a standard cell LSI is, for example, formed by the cell generator by using logical information indicated in a logical circuit diagram as shown in FIG. 2 or a logical description language as shown in FIG. 3. Note, the logical circuit diagram as shown in FIG. 2 is, for example, entered into a CAD tool and data of the logical circuit diagram is translated into the logical description language as shown in FIG. 3. Next, for example, a layout pattern of the cell is formed by the cell generator by inputting logical information of a logical description language. Note, the logical information of the logical description language may be generated not only by the CAD tool by translating the data of the logical circuit diagram, but also directly produced or input by a human operator.

As described above, the layout pattern shown in FIG. 4 is automatically formed by carrying out the placement process and the routing process at the transistor-constitution level. Note, the obtained layout pattern of the cell, which is output data of the cell generator, is not only of one type but a plurality of types, since plural types of layout patterns can be formed by the cell generator. In these plural layout patterns, a space occupied by one layout pattern is not the same as that of another layout pattern, and it is difficult to obtain an optimum layout pattern from those plural layout patterns. Further, almost all layout patterns formed by the cell generator are larger in size than a layout pattern formed by a person. Consequently, in practice, placement processing of small blocks is previously carried out a person, and only the routing process is carried out a computer system, e.g., a cell generator.

Figure 5:
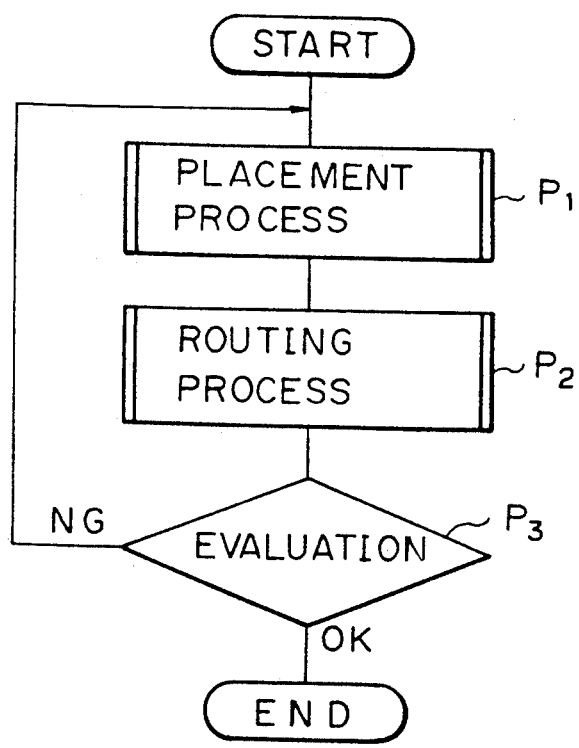
FIG. 5 is a flowchart indicating processes of a program for the cell generator according to the prior art.

FIG. 5 is a flowchart indicating processes of a program for the cell generator according to the prior art, and references $P_1$, $P_2$, and $P_3$ denote steps in the flow.

First, in the step $P_1$, a placement process is carried out for positioning a transistor at a suitable point. In the step $P_2$, after this placement process, a routing process for connection between the terminals of the transistors is carried out. Note, in the conventional art for forming a layout pattern of a semiconductor integrated circuit, the layout pattern is not formed in practice by a placement process at a transistor-constitution level by the cell generator, but is formed by defining functional blocks as shown in FIG. 2 and carrying out a routing process between the defined blocks. Further, the routing process has several variations, for example, the wiring configuration can be modified by changing a sequence in the routing process. Therefore, the routing process is carried out including various factors of the wiring sequence and the like.

Next, in the step $P_3$, the formed layout pattern of the cell (functional block) in the cell generator is evaluated. In the step $P_3$, when a layout pattern of the cell is decided to be satisfactory (OK), the process is completed. Conversely, in the step $P_3$, when wiring portions of the layout pattern formed by the cell generator are not satisfactorily wired (NG), the step $P_1$ is returned to improve the wiring portions so that they are wired in a more orderly manner. Therefore, in order to obtain an optimum cell layout, the above processes should be repeatedly carried out to feed-back information for improvement (for example, tens of thousands times or hundreds of thousands times). However, in practice, the layout pattern of a cell formed by a person is much better than that of a cell formed by a computer system, even if the above processes are carried out many times in the computer system.

As described above, in the conventional art for forming a layout pattern of a semiconductor integrated circuit, if the above processes are carried out repeatedly in the computer system or the cell generator, a satisfactory layout pattern or an optimum cell layout pattern cannot be always formed, processing time may be quite long, and a layout pattern of a cell formed by using a computer system or a cell generator, may not actually be used. Namely, software or a computer program for the cell generator cannot automatically form an optimum cell layout pattern.

Incidentally, in forming a cell layout pattern using a cell generator, targets of the cell generator can be roughly divided into the following two cases.

(I) A case in which a layout pattern is newly formed by analyzing a required logical circuit diagram for the purpose of adding a new cell to a cell library or providing a new custom LSI and the like.

(II) A case in which a layout pattern is reformed by providing high density and large scale integration. For example, when a predetermined transistor size is changed to a smaller size, for example, a basic transistor size in a basic cell is made smaller in accordance with an improvement in the producing art of semiconductor devices, a layout pattern of a functional block or a cell may be reformed. Particularly, when the shape of a transistor is changed, a previously used layout pattern (an existing layout pattern) of the cell should be entirely reformed. However, when only the size of a transistor is to be reduced, in some cases the existing layout pattern can be used by merely reducing the existing layout pattern.

If a cell library is completely changed, generally, about 100~200 kinds of layout patterns should be formed from the beginning.

Conventionally, a cell generator was equally used for the above two cases in accordance with the flow of processes shown in FIG. 5 without dividing the two cases, and thus the processing time of the cell generator was too long. Note, in case (II), the cell generator does not need to carry out all of the processes, however, in case (I), the cell generator should completely carry out all of the processes of the flow from the beginning. Namely, in case (II), for example, when space for the existing layout pattern is reduced by reducing the wiring size, or when the existing layout pattern is improved in accordance with a transistor shape in the basic cell, the cell generator need only carry out some of the processes shown in FIG. 5. However, in practice, the cell generator is equally used for the above two cases (I) and (II), the processes in the cell generator become extensive and the operation speed of the cell generator becomes too slow, and thus, in practice the layout pattern of the cell is mainly formed by a person.

Next, the principle and embodiments of a method and an apparatus for forming a layout pattern of a semiconductor integrated circuit according to the present invention will be explained.

The present invention provides a method for forming a layout pattern of a semiconductor integrated circuit comprising, a step for analyzing logical information down to a transistor-constitution level and inputting the analyzed logical information into a cell generator, and a step for automatically forming a layout pattern by a placement process and a routing process at the transistor-constitution level by the cell generator, which steps are the same as in conventional method. Further, the method of the present invention comprises a step of automatically reforming a layout pattern by carrying out only the routing process, when required logical information is the same as existing logical information and a required layout pattern is also the same as an existing layout pattern at the transistor-constitution level, by inputting connection information and layout information of the existing layout pattern into the cell generator, or a step of automatically reforming a layout pattern without analyzing the logical information down to the transistor-constitution level, when required logical information is the same as existing logical information but a required layout pattern is not the same as an existing layout pattern at the transistor-constitution level, by inputting a connection information of the existing layout pattern into the cell generator. Note, in the present invention, the required logical information should be same as the existing logical information, and thus the existing layout pattern, which is previously formed and used, can be utilized for reforming.

In the present invention, logical information extracted from the existing layout pattern which is existing logical information comprising connection information and layout information, is input into the cell generator. Namely, when the required layout pattern has the same configuration as the existing layout pattern, the connection information and the layout information of the existing layout pattern are input into the cell generator, and only a routing process is carried out by the cell generator and the placement process can be deleted in the cell generator. Further, when the transistor-constitution of the required layout pattern is not the same as that of the existing layout pattern, the logical information of the existing layout pattern is input into the cell generator, the inputting process of the logical information including the logical information can be deleted. However, the placement process and the routing process should be carried out by the cell generator. Consequently, processes in the cell generator become simple and processing time in the cell generator becomes short.

Below, the present invention will be concretely explained with reference to the accompanying drawings.

Figure 6A:
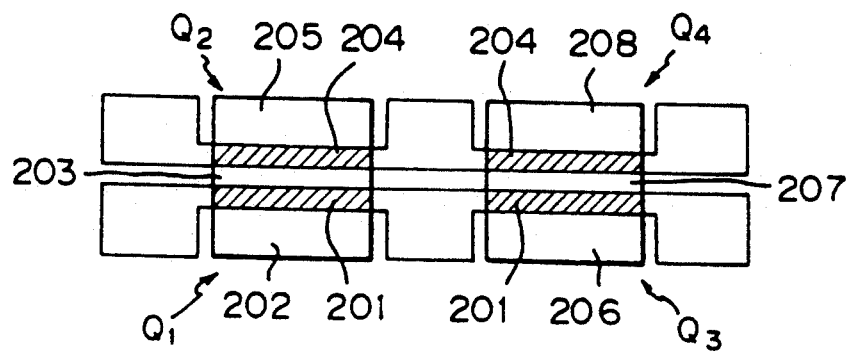
FIGS. 6A to 6D are diagrams indicating various transistor-constitutions in half of a basic cell.
Figure 6B:
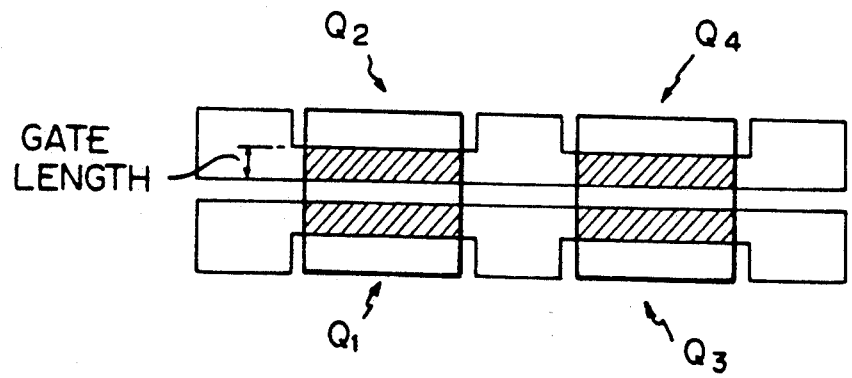
Figure 6C:
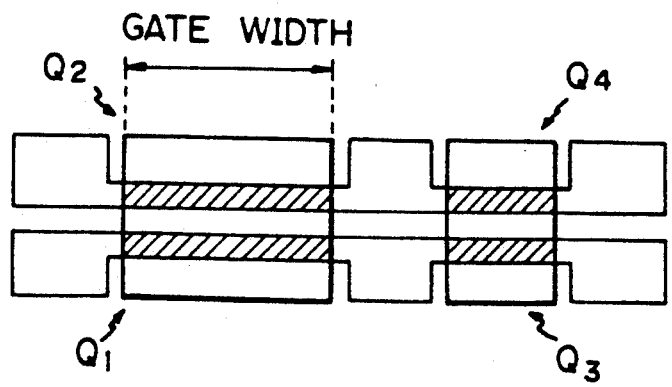
Figure 6D:
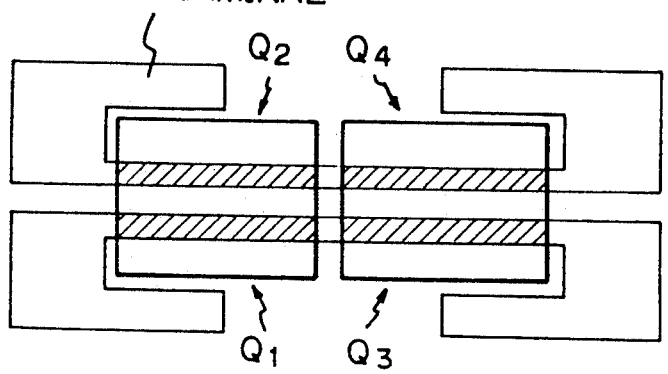
Figure 6E:
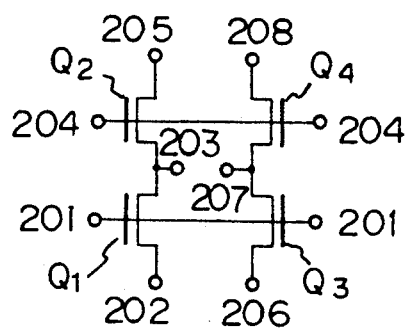
FIG. 6E is a circuit diagram of the transistor-constitutions shown in FIGS. 6A to 6D.
Figure 6F:
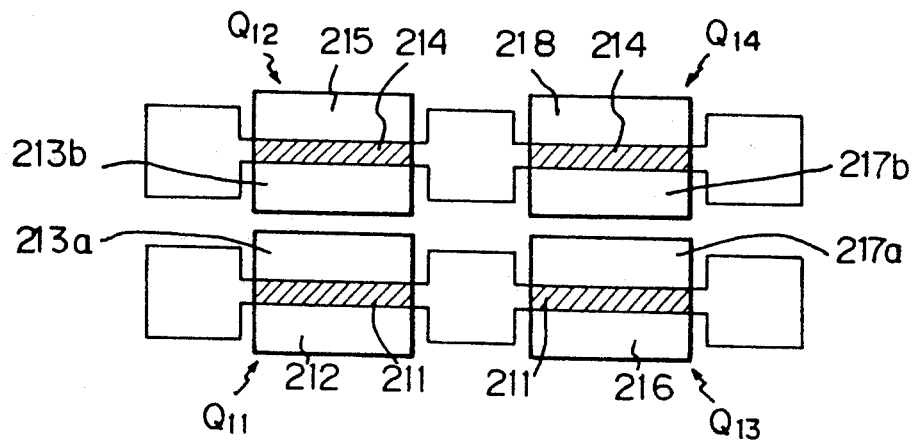
FIG. 6F is diagram indicating transistor-constitutions in half of a basic cell which is a different transistor-constitution from that shown in FIGS. 6A to 6D.
Figure 6G:
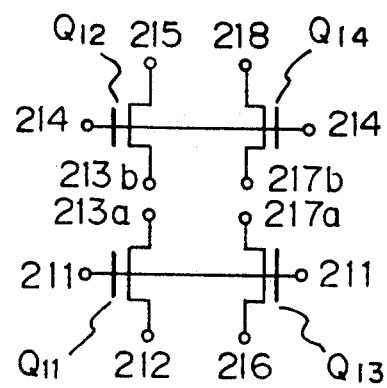
FIG. 6G is a circuit diagram of the transistor-constitution shown in FIG. 6F.
Figure 7:
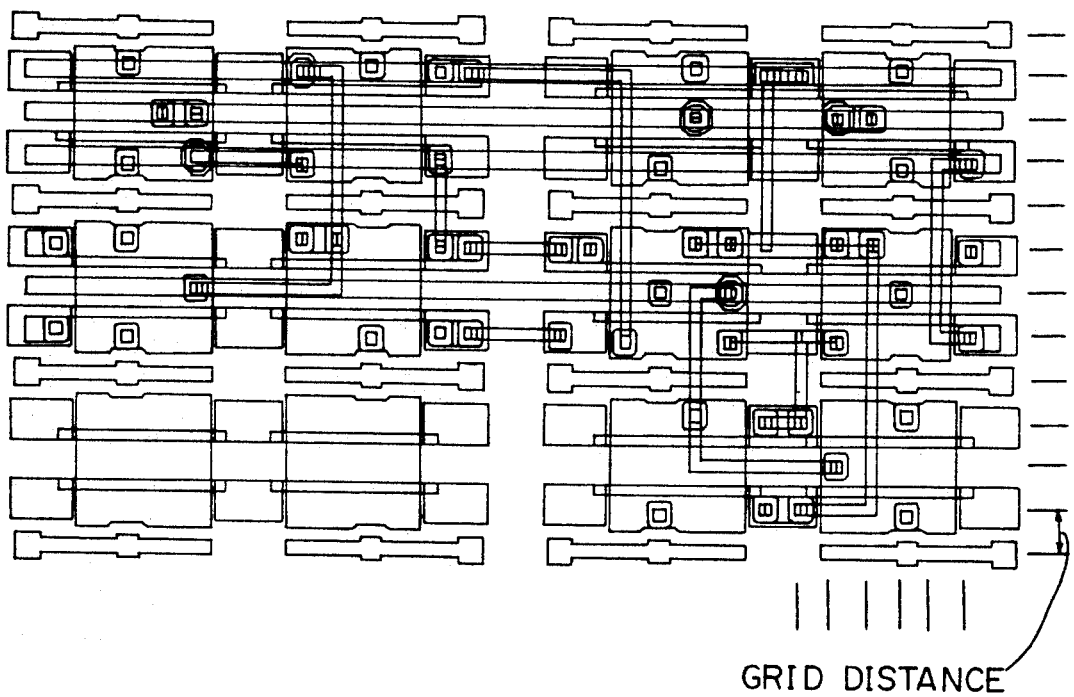
FIG. 7 is a diagram indicating a variation of the layout pattern shown in FIG. 4.

FIGS. 6A to 6D are diagrams indicating various transistor-constitutions in half of a basic cell, FIG. 6E is a circuit diagram of the transistor-constitutions shown in FIGS. 6A to 6D, FIG. 6F is diagram indicating transistor-constitutions in half of a basic cell which has a different transistor-constitution from that shown in FIGS. 6A to 6D, FIG. 6G is a circuit diagram of the transistor-constitution shown in FIGS. 6F, and FIG. 7 is a diagram indicating a variation of the layout pattern shown in FIG. 4.

In the above description, when a transistor configuration of a required layout pattern is quite different from an existing layout pattern, the present invention cannot be applied. In such a case, the processes explained above with reference to FIGS. 1 to 5 will be repeatedly carried out.

However, when required logical information is the same as existing logical information and a required layout pattern is also the same as an existing layout pattern at the transistor-constitution level, a cell generator applied to the present invention automatically reforms the required layout pattern by only a routing process, by inputting connection information and layout information of the existing layout pattern into the cell generator. Namely, an analyzing process of analyzing the logical information down to the transistor-constitution level and a placement process can be deleted.

A case in which required logical information is the same as existing logical information and a required layout pattern is also the same as an existing layout pattern at the transistor-constitution level is, for example, a case of varying the form a basic cell shown in FIG. 6A to each of the basic cell shown in FIGS. 6B to 6D. Namely, patterns of the transistors $Q_1$, $Q_2$, $Q_3$, $Q_4$ in each basic cell shown in FIGS. 6B to 6D are different from that of the transistors $Q_1$, $Q_2$, $Q_3$, $Q_4$ in the basic cell shown in FIG. 6A.

Concretely, for example, the gate length of each transistor $Q_1$, $Q_2$, $Q_3$, $Q_4$ of the basic cell shown in FIG. 6B is longer than that of the basic cell shown in FIG. 6A. With regard to FIG. 6C, the gate width of each transistor $Q_1$, $Q_2$, $Q_3$, $Q_4$ of the basic cell shown in FIG. 6C is different from that of the basic cell shown in FIG. 6A, and with regard to FIG. 6D, a shape of the gate electrode of each transistor $Q_1$, $Q_2$, $Q_3$, $Q_4$ of the basic cell shown in FIG. 6D is different from that of the basic cell shown in FIG. 6A. Note, the basic cells shown in FIGS. 6A to 6D are indicated by the same circuit diagram in the transistor-constitution shown in FIG. 6E. Furthermore, the case that required logical information is the same as existing logical information and a required layout pattern is also same the as an existing layout pattern in the transistor-constitution level is, for example, a case of varying form a grid distance (which indicates a minimum distance between neighboring wirings) of a layout pattern shown in FIG. 4 to that of a layout pattern in FIG. 7.

Next, when required logical information is the same as existing logical information but a required layout pattern is not the same as an existing layout pattern at the transistor-constitution level, a cell generator applied to the present invention automatically reforms the required layout pattern without analyzing the logical information down to the transistor-constitution level. Namely, an analyzing process of analyzing the logical information down to the transistor-constitution level need not be carried out.

A case that required logical information is the same as existing logical information but a required layout pattern is not the same as an existing layout pattern in the transistor-constitution level is, for example, a case of varying form a basic cell shown in FIG. 6A to a basic cell shown in FIG. 6F. The constitution of the transistor in the basic cell shown in FIG. 6F is different from that of the basic cell shown in FIG. 6A. Because source or drain terminals of the transistors $Q_{11}$, $Q_{12}$ and the transistors $Q_{13}$, $Q_{14}$ are formed by dividing the same electrodes 213a, 213b and 217a, 217b, however, the source or drain terminals of the transistors $Q_1$, $Q_2$ and the transistors $Q_3$, $Q_4$ are formed by the same electrodes 203 and 207. Note, the basic cell shown in FIG. 6F is not indicated by the circuit diagram shown in FIG. 6E, but by the circuit diagram shown in FIG. 6G.

As described above, for example, when a basic cell shown in FIG. 6A for constituting a layout pattern of a semiconductor integrated circuit is changed to each of the basic cells shown in FIGS. 6B to 6D, a required layout pattern is automatically reformed by only a routing process by inputting connection information and layout information of an existing layout pattern into a cell generator. Further, for example, when a basic cell shown in FIG. 6A for constituting a layout pattern of a semiconductor integrated circuit is changed to a basic cell shown in FIG. 6F, a required layout pattern is automatically reformed without analyzing logical information down to the transistor-constitution level by inputting connection information of an existing layout pattern into a cell generator. Namely, a required layout pattern is easily produced by using an existing layout pattern, even if the size or shape between the required layout pattern and the existing layout pattern are not the same and only the positional relationship of channel regions in the transistors between the required layout pattern and the existing layout pattern are the same.

Typically, the existing layout pattern is constituted by a basic cell. In practice, however, an existing layout pattern is almost always formed by a person, this formed layout pattern being nearly an optimum layout pattern, and the formed layout pattern can be used as is when a fixed wiring is changed without changing the size and shape of a transistor. In the above described method, a placement process can be deleted from the processes in the flowchart shown in FIG. 5, and thus, processing time can be greatly reduced by deleting a feed-back process and the number of non-connection portions can be held to a minimum by using the existing layout pattern which was practically used.

Furthermore, when a transistor-constitution of a required layout pattern is not the same as that of the existing layout pattern whose logical information is used as input data of the cell generator, the above layout information cannot be used, but the connection information can be used. In this case, the processes in FIG. 5 are necessary for the cell generator, but a process of inputting a logical circuit diagram and a process of forming a logical description language, which are shown in FIGS. 2 and 3, are not necessary, and thus a CAD system using the present invention can be made more efficient. Additionally, when an optimum layout is known, (for example, an optimum layout can be known by experience by a designer and the like), the feed-back process of the flowchart in FIG. 5 can be deleted.

Figure 8A:
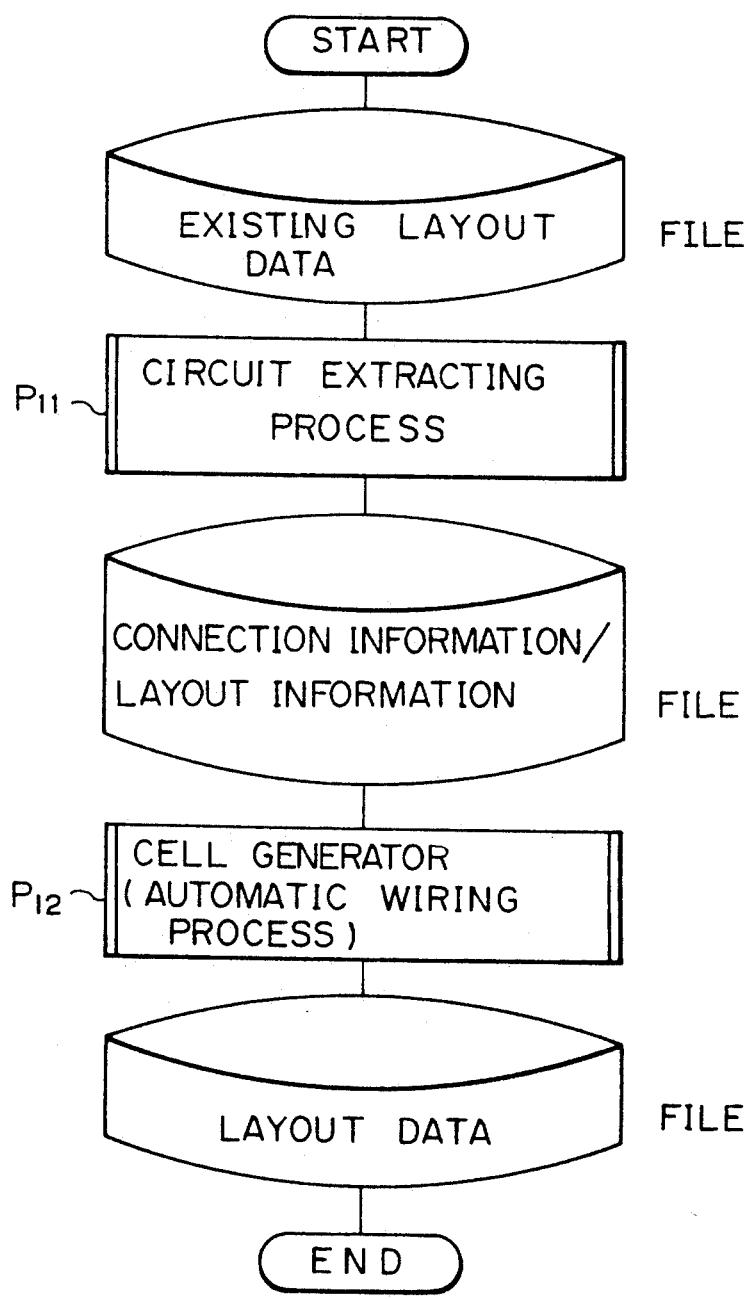
FIG. 8A is a flowchart indicating processes of a program for a cell generator according to the present invention.
Figure 8C:
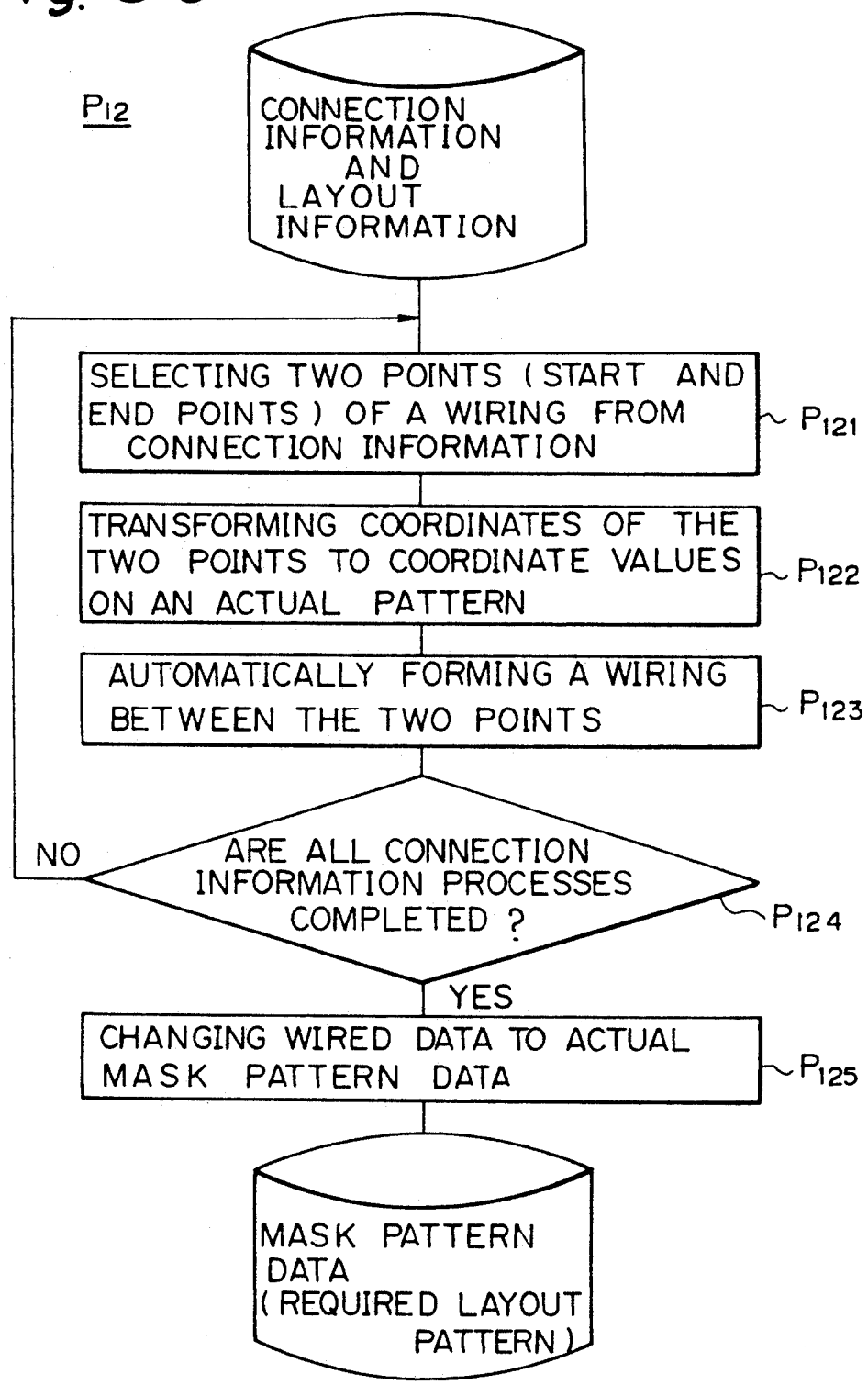
FIG. 8C is a flowchart indicating processes in an automatic routing process shown in FIG. 8A.

FIG. 8A is a flowchart indicating processes of a program for a cell generator according to the present invention, FIG. 8B is a flowchart for indicating processes in an extracting process shown in FIG. 8A, and FIG. 8C is a flowchart for indicating processes in an automatic routing process shown in FIG. 8A.

In FIG. 8A, references $P_{11}$ and $P_{12}$ denote each step of the flow. First, existing layout data correspond to a mask pattern data of an existing layout pattern is processed in a cell generator, and the flow proceeds to the step $P_{11}$.

Processing in the step $P_{11}$, as shown in FIG. 8B, will be explained next. First, in a step $P_{111}$, the mask pattern data for graphic data processing is changed, and next a step $P_{112}$, extracting a transistor by checking for overlapping of graphics between layers by using the changed data, is carried out. Next, in a step $P_{113}$, a connection between transistors is recognized by tracing a wire, and then moving to a step $P_{114}$ for deciding whether processes regarding all data are completed. In the step $P_{114}$, when it is decided that the processes for all data are completed, the flow proceeds to a step $P_{115}$ for changing data for a cell generator, and connection and layout information are obtained. In the step $P_{114}$, when it is decided that the processes for all data are not completed, the flow returns to the step $P_{112}$. Note, the connection information and the layout information, which correspond to logical information of the existing layout pattern analyzed down to a transistor-constitution level, are stored in a file. Further, the connection information and the layout information of the existing layout pattern (the extracted circuit) are derived in accordance with a verifying method applied to the conventional circuit extraction method. Namely, as shown in FIGS. 6A to 6E, connection information at a transistor-constitution level can be extracted by a transistor pattern and a wiring pattern, and the connection information at the transistor-constitution level only indicates connections between terminals of the transistors.

Next, a required layout pattern corresponding to mask pattern data is processed in the cell generator, and the flow proceeds to a step $P_{12}$.

Processing in the step $P_{12}$, as shown in FIG. 8C, will be explained next. First, in a step $P_{121}$, two points are selected, which are a start and an end points, of a wiring in the connection information obtained by the step $P_{11}$, and next in a step $P_{122}$, coordinates of the two points are transformed to coordinate values on an actual pattern. Next, in a step $P_{123}$, wiring between the two points is automatically carried out, and next in a step $P_{124}$, it is decided whether processes regarding all connection information are completed. In the step $P_{124}$, when it is decided that the processes for all connection information are completed, the flow proceeds to a step $P_{125}$ for changing wired data to an actual or a required mask pattern data, i.e., required pattern data. In the step $P_{124}$, when it is decided that the processes for all connection information are not completed, the flow returns to the step $P_{121}$. Note, the mask pattern data obtained by the step $P_{12}$ corresponds to layout data of the required layout pattern.

Figures 10A, 10C:
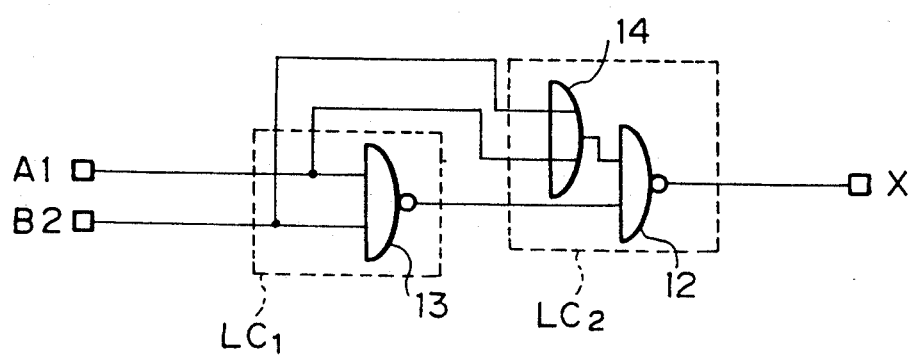
FIG. 10A is a diagram indicating an example of a logical circuit.
FIG. 10C is a diagram for indicating terminal connections in the logical circuit shown in FIG. 10A.
Figure 10B:
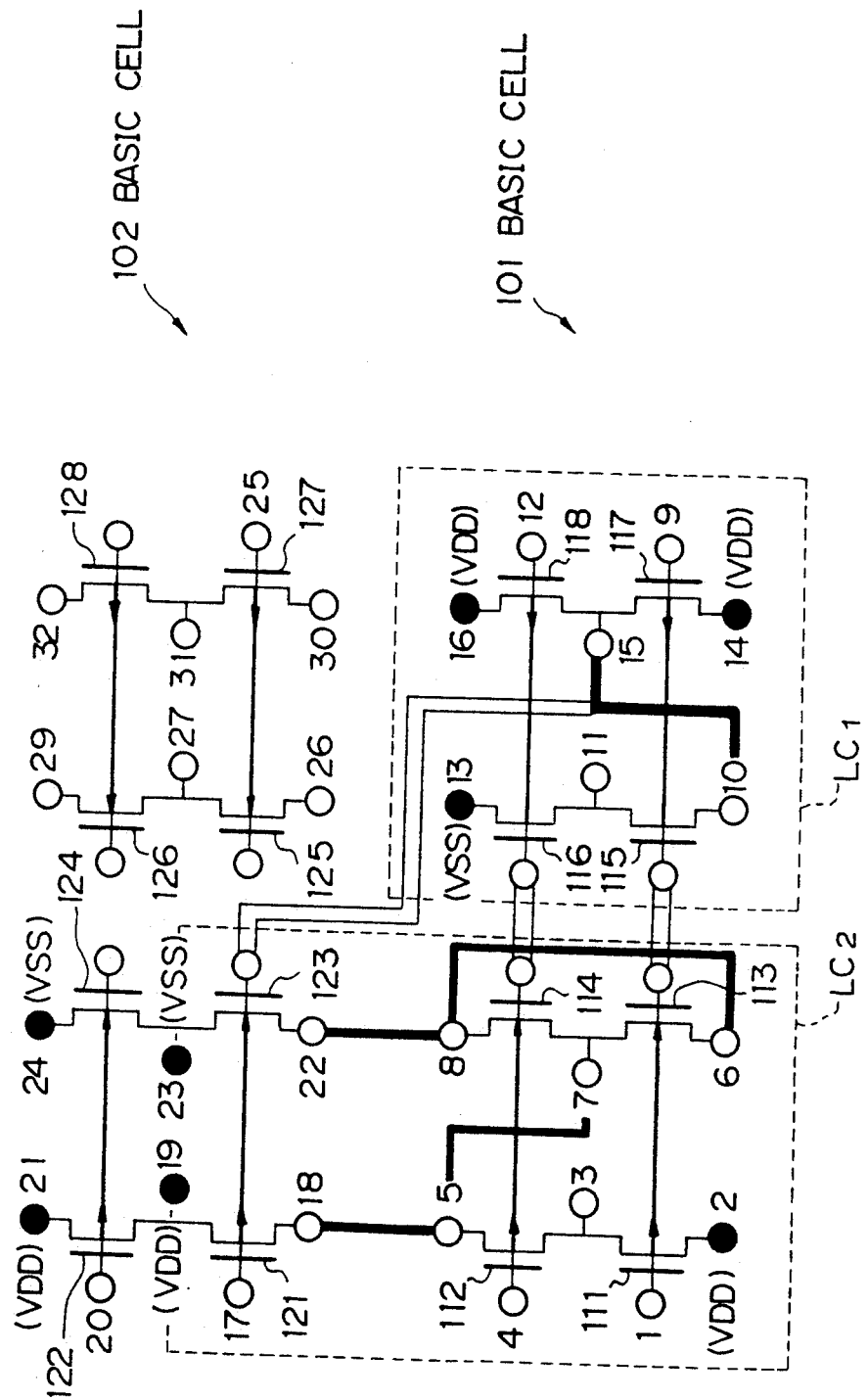
FIG. 10B is a diagram indicating a transistor-constitution in the logical circuit shown in FIG. 10A.

FIG. 9A is a diagram indicating a transistor-constitution in an example of a basic cell, FIG. 9B is a diagram indicating transistor connections in the basic cell shown in FIG. 9A, FIG. 10A is a diagram indicating an example of a logical circuit, FIG. 10B is a diagram indicating a transistor-constitution in the logical circuit shown in FIG. 10A, and FIG. 10C is a diagram for indicating terminal connections in the logical circuit shown in FIG. 10A.

In FIG. 9A, reference numeral 11 denotes a basic cell including eight transistors, that is, the basic cell is constituted by P-channel type transistors Tr1, Tr2, Tr7 and Tr8, and N-channel type transistors Tr3, Tr4, Tr5 and Tr6. Note, the basic cell shown in FIG. 9A is formed by connecting two blocks each having four transistors indicated in FIGS. 6A to 6D, and a semiconductor integrated circuit is constituted by using a plurality of basic cells. As shown in FIG. 9A, the basic cell is formed only by transistor patterns, and a logical circuit shown in FIG. 10A is formed by carrying out a routing process as shown in FIG. 10B. Note, in FIG. 9A, reference mark ◯ denotes a terminal of a transistor and each reference numeral close to the mark ◯ denotes a terminal number of the respective transistor.

FIG. 9B is a list of transistors extracted by the transistor configuration in FIG. 9A. In this extracted list, references G and S/D denote a gate terminal and a source/drain terminal in each transistor, and the same connection portions are indicated by the same reference numerals. For example, as shown in FIG. 9A, a terminal number 3 is commonly connected to source/drain terminals of transistors Tr1 and Tr2, and thus, in the list shown in FIG. 9B, a numeral "3" is shown at portions crossing between one source drain terminal S/D and the transistor Tr2 and the other source drain terminal S/D and the transistor Tr1. Consequently, it can be understood from the list shown in FIG. 9B that the source drain terminals S/D of the transistor Tr1 and Tr2 are commonly connected without reference to FIG. 9A. Additionally, for example, in FIG. 9A, a gate of the transistor Tr1 is commonly connected to a gate of the transistor Tr3, and thus, in the list shown in FIG. 9B, a numeral "3" is shown at portions crossing between a gate terminal G and the transistor Tr1 and the gate terminal G and the transistor Tr3, respectively. Consequently, a logical circuit diagram constituted by transistors of a plurality of basic cells, as indicated in FIG. 9A, can be described by referring to a list of transistor connections as shown in FIG. 9B. Note, logical information of an existing layout pattern corresponds, for example, to the data indicated in the list shown in FIG. 9B, and this logical information is input to the cell generator. Further, when the size of transistors in a basic cell or the shape of the transistors and a configuration of the transistor-configuration in the memory cell are not changed, the logical circuit diagram and the list of transistor connections can be used and connection information of the existing layout pattern is input into the cell generator.

Incidentally, since the extracting process in the above step P11 is generally carried out for the purpose of verifying a pattern formed by a person, in a conventional case (most cases at the present time), the formed pattern is processed by using a circuit extracting program and a circuit shown in FIGS. 9A or 10B is extracted. Consequently, a new special device is not necessary when extracting connection information and layout information from existing layout data.

In a practical design process of a layout pattern, a connecting process for connecting each terminal of a transistor, which is known as a routing process, is only carried out when a transistor constitution of a basic layout is not changed. FIG. 10A is a logical circuit diagram including two NAND gates 12 and 13, and an OR gate 14. FIG. 10B is a diagram of transistor connections constituted by a block LC$_2$ including the NAND gate 12 and the OR gate 14, and a block LC$_1$ including the NAND gate 13 on two basic cells 101 and 102. In FIG. 10B, the basic cell 101 is constituted by P-channel type transistors 111, 112, 117, and 118, and N-channel type transistors 113, 114, 115, and 116, and the basic cell 102 is constituted by P-channel type transistors 121, 122, 127 and 128, and N-channel type transistors 123, 124, 125 and 126. Note, in FIG. 10B, reference marks ○ and ● denote terminals of the transistors in the basic cells 101 and 102, and each of reference numerals 1 to 32 close to the marks ○ and ● denotes a terminal number of the respective transistor.

During these terminals, terminals connected to power supplies V$_{DD}$ and V$_{SS}$ are shown by the mark ●, and an actual wiring line is shown by a thick solid line. Note, in this embodiment, transistors 125 to 128 of the basic cell 102 are not used for the logical circuit diagram shown in FIG. 10A. Furthermore, the list shown in FIG. 10C indicates connection information, of the logical information in a logical circuit having the transistor-constitution shown in FIG. 10B. This connection information indicates connection data between terminals of the transistors. In the above descriptions, information obtained by extracting a circuit from a layout pattern only indicates connection informations between the terminals of specific numbers in the transistors. Concretely, in FIG. 10C, the list indicates that terminals 2, 14, 16, 19, and 21 are connected to the power supply V$_{DD}$, and terminals 5, 7, and 18 are commonly connected. As described above, the extracted information is only connection information of terminals in the transistors shown in FIG. 10C. However, when the connection information of the terminals is obtained, only a connecting process need be carried out. Consequently, the connection information of the terminals is input to the cell generator, a layout of the transistors is not necessary, and a layout pattern of the cell can be automatically formed by only a routing process in the cell generator.

As described above, for example, when a required layout pattern has the same configuration as an existing layout pattern, connection information and layout information of the existing layout pattern are input into a cell generator, and only a routing process is carried out by the cell generator and a placement process can be deleted in the cell generator. Further, for example, when a transistor-constitution of a required layout pattern is not the same as that of an existing layout pattern, logical information of the existing layout pattern is input into a cell generator, and an inputting process of the logical information including logical information can be deleted. However, a placement process and a routing process should be carried out by the cell generator. Consequently, processes in the cell generator become simple and, processing time in the cell generator becomes short. Concretely, in the case that a layout pattern of a cell is formed in about tens minutes using a CAD system including a cell generator in the prior art, the layout pattern of the cell is formed in only about several seconds by the present invention. In actual use, a cell library (for example, including about one hundred cell layout patterns) which can be reformed in a few hours by a CAD system using the present invention, would take some months for a person using the prior art.

Many widely different embodiments of the present invention may be constructed without departing from the spirit and scope of the present invention, and it should be understood that the present invention is not limited to the specific embodiments described in this specification, except as defined in the appended claims.

We claim:

1. A method of forming a layout pattern of a semiconductor integrated circuit having regular transistor constitutions, said method comprising:

a step of receiving logical information;

a step of automatically forming the layout pattern by performing a placement process for determining relative positions of transistors and a routing process for determining wiring connections of the transistors at a transistor-constitution level; and a step of automatically reforming the layout pattern forming a reformed layout pattern by only performing the routing process, when required logical information is the same as existing logical information and a required layout pattern is also the same as an existing layout pattern at the transistor-constitution level, using connection information and layout information of said existing layout pattern.

2. A method of forming a layout pattern of a semiconductor integrated circuit as claimed in claim 1, wherein said logical information is indicated by a logical circuit diagram.

3. A method of forming a layout pattern of a semiconductor integrated circuit as claimed in claim 1, wherein said logical information is indicated by a logical description language.

4. A method of forming a layout pattern of a semiconductor integrated circuit as claimed in claim 1, wherein said required layout pattern and said existing layout pattern comprise a plurality of basic cells including a plurality of transistors.

5. A method of forming a layout pattern of a semiconductor integrated circuit as claimed in claim 4, wherein a pattern of the plurality of transistors in the plurality of basic cells of said required layout pattern is different from that of said existing layout pattern.

6. A method of forming a layout pattern of a semiconductor integrated circuit as claimed in claim 5, wherein a gate length of each of the plurality of transistors in the plurality of basic cells of said required layout pattern is different from that of said existing layout pattern.

7. A method of forming a layout pattern of a semiconductor integrated circuit as claimed in claim 5, wherein a gate width of each of the plurality of transistors in the plurality of basic cells of said required layout pattern is different from that of said existing layout pattern.

8. A method of forming a layout pattern of a semiconductor integrated circuit as claimed in claim 1, wherein said reformed layout pattern is used for forming a cell including some logic gates.

9. A method of forming a layout pattern of a semiconductor integrated circuit as claimed in claim 1, wherein said cell generator is used in a computer aided design system.

10. A method of forming a layout pattern of a semiconductor integrated circuit having regular transistor constitutions, said method comprising:
a step of receiving logical information;
a step of automatically forming the layout pattern by performing a placement process for determining relative positions of transistors and a routing process for determining wiring connections of the transistors at a transistor-constitution level; and
a step of automatically reforming the layout pattern forming a reformed layout pattern without analyzing the logical information down to the transistor-constitution level, when required logical information is the same as existing logical information but a required layout pattern is not the same as an existing layout pattern at the transistor-constitution level, using connection information of said existing layout pattern.

11. A method of forming a layout pattern of a semiconductor integrated circuit as claimed in claim 10, wherein said logical information is indicated by a logical circuit diagram.

12. A method of forming a layout pattern of a semiconductor integrated circuit as claimed in claim 10, wherein said logical information is indicated by a logical description language.

13. A method of forming a layout pattern of a semiconductor integrated circuit as claimed in claim 10, wherein said required layout pattern and said existing layout pattern comprise a plurality of basic cells including a plurality of transistors.

14. A method of forming a layout pattern of a semiconductor integrated circuit as claimed in claim 13, wherein a constitution of the plurality of transistors in the plurality of basic cells of said required layout pattern is different from that of said existing layout pattern.

15. A method of forming a layout pattern of a semiconductor integrated circuit as claimed in claim 10, wherein said reformed layout pattern is used for forming a cell including some logic gates.

16. A method of forming a layout pattern of a semiconductor integrated circuit as claimed in claim 10, wherein said cell generator is used in a computer aided design system.

17. An apparatus for forming a layout pattern of a semiconductor integrated circuit having regular transistor constitutions, said method comprising:
means for receiving logical information and inputting said logical information to a cell generator;
means for automatically forming a layout pattern by performing a placement process for determining relative positions of transistors and a routing process for determining wiring connections of the transistors at a transistor-constitution level;
first reforming means for automatically reforming the layout pattern forming a reformed layout pattern by only performing the routing process, when required logical information is the same as existing logical information and a required layout pattern is also the same as an existing layout pattern at the transistor-constitution level, using connection information and layout information of said exiting layout pattern; and
second reforming means for automatically reforming the layout pattern forming the reformed layout pattern without analyzing the logical information down to the transistor-constitution level, when the required logical information is the same as the existing logical information but the required layout pattern is not the same as the existing layout pattern at the transistor-constitution level, using connection information of said existing layout pattern.

18. An apparatus for forming a layout pattern of a semiconductor integrated circuit as claimed in claim 17, wherein said logical information is indicated by a logical circuit diagram.

19. An apparatus for forming a layout pattern of a semiconductor integrated circuit as claimed in claim 17, wherein said logical information is indicated by a logical description language.

20. An apparatus for forming a layout pattern of a semiconductor integrated circuit as claimed in claim 17, wherein said required layout pattern and said existing layout pattern comprise a plurality of basic cells including a plurality of transistors.

21. An apparatus for forming a layout pattern of a semiconductor integrated circuit as claimed in claim 20, wherein said first reforming means automatically reforms a layout pattern by only performing the routing process, even if the pattern of each of the plurality of transistors in the basic cells of said required layout pattern is different from that of said existing layout pattern.

22. An apparatus for forming a layout pattern of a semiconductor integrated circuit as claimed in claim 21, wherein said first reforming means automatically reforms a layout pattern by only performing the routing process, even if the gate length of each of the plurality of transistors in the plurality of basic cells of said required layout pattern is different from that of said existing layout pattern.

23. An apparatus for forming a layout pattern of a semiconductor integrated circuit as claimed in claim 21, wherein said first reforming means automatically reforms a layout pattern by only performing the routing process, even if the gate width of each of the plurality of transistors in the plurality of basic cells of said required layout pattern is different from that of said existing layout pattern.

24. An apparatus for forming a layout pattern of a semiconductor integrated circuit as claimed in claim 20, wherein said second reforming means automatically reforms a layout pattern without analyzing the logical information down to the transistor-constitution level, when the constitution of each of the plurality of transistors in the plurality of basic cells of said required layout pattern is different from that of said existing layout pattern.

25. An apparatus for forming a layout pattern of a semiconductor integrated circuit as claimed in claim 17, wherein said reformed layout pattern is used for forming a cell including some logic gates.

26. An apparatus for forming a layout pattern of a semiconductor integrated circuit as claimed in claim 17, wherein said cell generator is used in a computer aided design system.

* * * * *

UNITED STATES PATENT AND TRADEMARK OFFICE
CERTIFICATE OF CORRECTION

PATENT NO. : 5,247,456
DATED : September 21, 1993
INVENTOR(S) : Ryoichi OHE et al.

It is certified that error appears in the above-identified patent and that said Letters Patent is hereby corrected as shown below:

On title page, item [22], change "1988" to --1989--.

Signed and Sealed this

Sixteenth Day of August, 1994

*Attest:*

BRUCE LEHMAN

*Attesting Officer*         *Commissioner of Patents and Trademarks*